United States Patent
Honal et al.

(10) Patent No.: US 11,855,607 B2
(45) Date of Patent: Dec. 26, 2023

(54) ELECTRO-ACOUSTIC RESONATOR AND METHOD OF FORMING THEREOF

(71) Applicant: RF360 SINGAPORE PTE. LTD., Singapore (SG)

(72) Inventors: Matthias Honal, Munich (DE); Tomasz Jewula, Markt Schwaben (DE); Pei Wen Qiao, Singapore (SG); Siew Li Poh, Singapore (SG); Siew Ling Koh, Singapore (SG)

(73) Assignee: RF360 Singapore Pte. Ltd., San Diego, CA (US)

( * ) Notice: Subject to any disclaimer, the term of this patent is extended or adjusted under 35 U.S.C. 154(b) by 463 days.

(21) Appl. No.: 17/046,705

(22) PCT Filed: Apr. 24, 2019

(86) PCT No.: PCT/EP2019/060497
§ 371 (c)(1),
(2) Date: Oct. 9, 2020

(87) PCT Pub. No.: WO2019/206986
PCT Pub. Date: Oct. 31, 2019

(65) Prior Publication Data
US 2021/0075397 A1     Mar. 11, 2021

(30) Foreign Application Priority Data

Apr. 24, 2018   (DE) .................. 102018109849.9

(51) Int. Cl.
*H03H 9/02*   (2006.01)
*H03H 9/145*   (2006.01)
(Continued)

(52) U.S. Cl.
CPC .......... *H03H 9/14541* (2013.01); *H03H 3/08* (2013.01); *H03H 9/02559* (2013.01); *H03H 9/02937* (2013.01); *H03H 9/25* (2013.01)

(58) Field of Classification Search
CPC .......... H03H 9/14541; H03H 9/02559; H03H 9/02937
(Continued)

(56) References Cited

U.S. PATENT DOCUMENTS

2002/0113526 A1* 8/2002 Nishihara .......... H03H 9/14541
310/322
2002/0195675 A1* 12/2002 Hakamada ......... H03H 9/02897
257/416
(Continued)

FOREIGN PATENT DOCUMENTS

EP    2175556 A1    4/2010

OTHER PUBLICATIONS

International Search Report and Written Opinion dated Aug. 6, 2019, corresponding to Application No. PCT/EP2019/060497.
(Continued)

*Primary Examiner* — Derek J Rosenau
(74) *Attorney, Agent, or Firm* — Patterson + Sheridan LLP

(57) ABSTRACT

An electro-acoustic resonator comprises a piezoelectric substrate on which an electrode structure is disposed. The electrode structure comprises a metal layer of aluminum and copper, a barrier layer forming a barrier against the diffusion of copper and another metal layer disposed on the barrier layer comprising aluminum. An AlCu intermetallic phase formed after an anneal is restricted to the portion beneath the barrier layer so that Galvano-corrosion of the electrode structure is avoided.

12 Claims, 3 Drawing Sheets

(51) Int. Cl.
*H03H 3/08* (2006.01)
*H03H 9/25* (2006.01)

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2005/0179340 A1 | 8/2005 | Yoshioka et al. |
| 2010/0187947 A1* | 7/2010 | Mimura ............... H03H 9/0222 310/365 |
| 2013/0234558 A1 | 9/2013 | Tsuda |

OTHER PUBLICATIONS

Draissia M., et al., "Structure and Hardness of the Sputtered Al—Cu Thin Films System," Physica Scripta, vol. 69, No. 4, Jan. 1, 2004 (Jan. 1, 2004), 4 pages, XP055608628, GB ISSN, 0031-8949, DOI: 10.1238/Physica.Regular.069a00348, 2. Elaboration procedure, 3. Chemical and structure characterization; p. 348; figures 1-4, Table I 4. Mechanical properties, p. 348, right-hand col.—p. 350, left-hand col. figures 5. 6.

* cited by examiner

ELECTRO-ACOUSTIC RESONATOR AND METHOD OF FORMING THEREOF

CROSS-REFERENCE TO RELATED APPLICATIONS

This application is a national stage application under 35 U.S.C. 371 of PCT/EP2019/060497, filed Apr. 24, 2019, which claims the benefit of German Application No. 102018109849.9, filed Apr. 24, 2018, both of which are incorporated herein by reference in their entireties.

TECHNICAL FIELD

The present disclosure relates to an electro-acoustic resonator. Specifically, the present disclosure relates to an electro-acoustic resonator having an electrode structure disposed on a piezoelectric substrate such as a surface acoustic wave resonator. The present disclosure also relates to a method of forming an electro-acoustic resonator including the forming of an electrode structure on a piezoelectric substrate.

BACKGROUND

Electro-acoustic resonators are widely used in electronics to realize RF filters, oscillators and other electronic sub-functions. The operation of electro-acoustic resonators is based on the interaction of electrical signals with acoustic waves. One type of electro-acoustic resonators is a surface acoustic wave (SAW) resonator in which an interdigital transducer (IDT) converts electrical signals to acoustic waves and vice versa. The IDT includes an interleaved comb-like electrode structure disposed on the piezoelectric substrate. An electrical signal applied to the IDT is converted into an acoustic wave that propagates through the piezoelectric substrate from the input IDT to the output IDT, thereby performing an electronic filtering function with respect to the electrical input-output signal path.

Conventional electrode structures for IDTs comprise aluminum to which a small amount of copper is added to increase the acoustic hardness of the electrode. During manufacturing, an anneal is performed to allow the copper to diffuse through the aluminum portion of the electrode, thereby forming an intermetallic phase of aluminum and copper. Primarily, grains of $Al_2Cu$ grow in the aluminum layer. In the resulting electrode after the anneal, $Al_2Cu$ grains are located adjacent to the non-converted Al grains.

The $Al_2Cu$ grains may reach the surface of the electrodes so that Al grains and $Al_2Cu$ grains in contact with each other form a Galvano-element at the top and sidwall electrode surfaces. Such an electrode is susceptible to corrosion, especially in the presence of corrosive media that may be applied during the manufacturing process. For example, after the anneal step during further manufacturing of the electrode structure, the surface of the electrodes may be subjected to cleaning and rinsing steps. Furthermore, the electrode may be in contact with relative aggressive substances such as developer media that may be applied during photolithography steps that are performed to trim or tune the electrode structures of the SAW device. Specifically, an IDT electrode structure may be trimmed using a photolithography mask to fine-tune the resonance frequency of the SAW device. A developer medium to develop exposed photoresist often uses highly corrosive basic or alkaline solvents. When the $Al_2Cu$ grains in contact with the Al grains at the surface of the IDT electrode structure are subjected to the corrosive media from photo developers, a Galvano-corrosion process takes place so that the less noble metal, i.e. aluminum, corrodes. As a result, the Al grains may break out from the electrode so that the electro-acoustic properties of the SAW device are heavily deteriorated. Photolithographic trimming processes are therefore forbidden during the conventional manufacturing process for SAW filters that impacts the yield of the manufacturing process.

Therefore, there is a need to provide an electrode structure for an electro-acoustic resonator that is less susceptible to Galvano-corrosion.

It is an object of the present disclosure to provide an electro-acoustic resonator of which the electrode structure is resistant to Galvano-corrosion.

It is another object of the present disclosure to provide an electro-acoustic resonator that can be manufactured with higher yield.

It is yet another object of the present disclosure to provide a method to manufacture an electro-acoustic resonator that is resistant to Galvano-corrosion.

It is yet another object of the present disclosure to provide a method of manufacturing an electro-acoustic resonator that has a high yield.

SUMMARY

According to the present disclosure one or more of the above-mentioned objects are achieved by an electro-acoustic resonator, that comprises: a substrate, the substrate having piezoelectric properties; an electrode structure disposed on the substrate, the electrode structure comprising: a metal layer, the metal layer comprising aluminum and copper; a barrier layer disposed on the metal layer to form a barrier against the diffusion of copper; and another metal layer disposed on the barrier layer, the other metal layer comprising aluminum.

According to an embodiment, an electro-acoustic resonator of the surface acoustic wave (SAW) working principle comprises an electrode structure that is disposed on a piezoelectric substrate. Various piezoelectric substrate materials are useful to realize a SAW device, such as lithium niobate ($LiNbO_3$) and lithium tantalate ($LiTaO_3$). The electrode structure comprises a metal layer that includes aluminum and copper. During the manufacturing of the device, the copper layer is deposited first and the aluminum layer is deposited thereon. After an anneal step, the copper migrates or diffuses through the aluminum and forms an intermetallic phase of aluminum and copper such as $Al_2Cu$. A barrier layer is formed on the above-mentioned first layer of aluminum so that the migration or diffusion of copper is confined to the first aluminum layer underneath the barrier layer. The diffusion barrier layer is of such a material that it inhibits the diffusion of copper beyond the barrier layer and forms a barrier against the diffusion of copper. Another second layer of aluminum is formed on the barrier layer. No copper reaches the second aluminum layer because it is separated from the first aluminum layer by the barrier layer. The copper content in the first aluminum layer forming the $Al_2Cu$ grains causes an acoustically hard material to avoid a migration of material within the electrode, although the electrode is exposed to mechanical stress from the acoustic resonating waves in the presence of electrical fields during its operation. The second layer of aluminum exhibits high electrical conductivity so that the ohmic resistance for electrical signals is low.

According to an embodiment, the amount of copper and the amount of aluminum in the first metal layer are selected such that, firstly, substantially all the available copper is transformed to $Al_2Cu$ during the anneal process, and, secondly, no untransformed original aluminum remains in the first metal layer. After the anneal, there is basically no pure aluminum present in the first metal layer that reaches the sidewall surface of the electrode. Specifically, the amount of copper relative to the amount of aluminum in the first metal layer is determined such that no combination of Al grains with $Al_2Cu$ grains appears at the sidewall surface of the electrode so that there is no realistic risk of Galvano-corrosion at the surface of the electrode, especially at the surface of the lower electrode portion adjacent to the substrate. In particular, the mass content of copper within the first metal layer is substantially equal or equal to the mass content of aluminum in the first metal layer. That is that the deposited mass amount of aluminum in the first aluminum layer is substantially the same or the same as the deposited mass amount of copper. The relation of the mass of copper to the mass of aluminum is about 1:1.

The relation of thicknesses of the first metal layer adjacent to the substrate and of the second metal layer distant from the substrate above the barrier layer may be chosen such that the desired acoustic properties of the SAW device are achieved. According to a first embodiment, the thickness of the first metal layer including copper and aluminum with respect to the thickness of the second layer including pure aluminum may be 1:2, that is that the thickness of the first metal layer is about half of the thickness of the second metal layer or the thickness of the second metal layer is about two times the thickness of the first metal layer. That is that the barrier layer is positioned at a height of one third within the combined aluminum mass of the first and second metal layers.

The portion of the electrode adjacent to the piezoelectric substrate is subjected to substantial mechanical stress due to the propagating acoustic wave. In particular, the corner portions of the electrode at the sidewalls of the electrode adjacent to the surface of the substrate are the electrode portions having the most mechanical stress in the SAW device. The addition of copper to the aluminum and the forming of $Al_2Cu$ grains is known to enhance the mechanical stability of the electrode. In accordance with the present disclosure, the first metal layer and the portion of the electrode adjacent to the piezoelectric substrate comprises $Al_2Cu$ grains only. Up to about 100% of that electrode portion that is confined by the barrier layer includes $Al_2Cu$ grains only and no, or substantially no Al grains. All available aluminum in that electrode portion is converted to $Al_2Cu$. The SAW device according to the present disclosure includes the power-durable $Al_2Cu$ grains in a limited region of the electrode close to the substrate that is subjected to the highest mechanical stress during electro-acoustic operation. Consequently, the SAW device has increased power durability when compared to electrodes without a barrier layer.

The barrier layer within the electrode of the SAW device and the appropriate mass relations of Cu and Al according to the present disclosure cause that no $Al_2Cu$ grains in contact with Al grains reach the surface of the electrode. Thus, the electrode can be treated with corrosive substances such as cleaning and rinsing fluids and even corrosive basic developer solvents used during photolithography processing. The electrode structure formed according to the principles of this disclosure can therefore be fine-tuned with photolithography processes that include the forming of a photoresist layer, the exposing of the photoresist to a defined pattern of radiation and the developing of the exposed photoresist layer. Developed/undeveloped portions of the photoresist are removed and the remaining photoresist portions act as a mask for trimming the electrode structure. This process enables a precise trimming of the electrode structure so that the SAW device achieves a defined resonance frequency. It also allows a repair of the electrode structure to increase the yield of the manufacturing process.

The electro-acoustic resonator allows additional processing options such as tuning and trimming by photolithography processes, increases the power durability of the device in that the $Al_2Cu$ grains are primarily confined to the lower portion of the electrode and increases the overall yield of the manufacturing process.

According to another embodiment, the thickness of the first metal layer including copper and aluminum is larger than the thickness of the second metal layer. The thickness of the first metal layer may be substantially larger than the thickness of the second metal layer. For example, the thickness of the second metal layer may be in the range of 15 nm to 30 nm, preferably the second metal layer has a thickness in the range of 20 nm to 25 nm. The thickness of the first metal layer is determined such that the overall thickness of the electrode meets the desired acoustic resonating conditions. In this embodiment, the first metal layer may still comprise pure Al grains in vicinity to transformed $Al_2Cu$ grains. The top surface of the electrode in the second metal layer shows only pure aluminum, whereas the sidewalls of the first metal layer may include Al grains in connection with $Al_2Cu$ grains. This embodiment minimizes corrosion at the surface of the electrode. As an advantage of this embodiment, only a limited thickness of a second metal layer of pure Al remains on the top of the electrode so that the first metal layer including Al grains in connection with $Al_2Cu$ grains has a larger thickness. The amount of copper in the first metal layer may be in the range of 2 to 9 weight-% compared to the first aluminum layer. As a result, the power durability for certain ranges of resonance frequencies is maintained using a thicker first metal layer, and resistance against Galvano-corrosion is increased. While trading off the thickness of first metal layer and the amount of copper in the first metal layer against the thickness of second metal layer, the power performance and the corrosion resistance can be optimized for a specific field of application of the resonator.

As concerns the barrier layer, any material that is useful to form a barrier against the migration or diffusion of copper within aluminum is useful. The barrier layer has the function of inhibiting the diffusion of copper beyond the barrier layer within the aluminum. Materials that exhibit this functionality are known to the skilled artisan. For example, the diffusion barrier layer may be a layer of a suitable metal or a corresponding metal nitride. Specifically, the barrier layer may be formed of or may comprise titanium, chromium, cobalt, tantalum, tungsten or a composition of these metals. In addition or alternatively, the barrier layer may comprise a metal nitride such as titanium nitride, tantalum nitride or tungsten nitride. The barrier layer may consist of one of said metals or metal nitrides or may comprise a sandwich of one or more of said metals or metal nitrides. According to the principles of the present disclosure, a barrier layer of the above-mentioned metals and metal nitrides disposed within the electrode of an electro-acoustic resonator prevents the diffusion of copper beyond the barrier layer.

According to the present disclosure, a seed layer may be provided between the first metal layer of copper and aluminum and the substrate. That is, the seed layer is formed on top of the piezoelectric substrate to promote the adhesion of the deposited copper layer and, after the anneal, the first metal layer comprising $Al_2Cu$ grains. A useful material as a seed layer is a layer of titanium.

As an alternative, the seed layer may be made of a material that has a Vickers hardness of at least 1 Gigapascal (GPa). In this case, the seed layer is a stiff material so that the electrode structure exhibits increased acoustic hardness. Furthermore, the seed layer can be made sufficiently thick to additionally increase the acoustic hardness of the electrode.

Suitable metals that fulfil this condition and that are compatible with the aluminum-copper (AlCu) system of the electrode are chromium, cobalt, niobium, molybdenum and tungsten. These metals have either a body centred cubic (bcc) crystal structure or a hexagonal closed packed (hcp) crystal structure. The atomic layers in the hcp crystal structure are similar or identical to the atomic structure of Cu or Al so that there is a good matching between the crystal structures of the seed layer and the AlCu portion of the electrode leading to large grain size. The use of metals having bcc crystal structures for the seed layer allows the forming of the AlCu electrode system with small grain sizes that reduces the acousto-migration in the AlCu electrode. On the other hand, the hardness of the seed layer is sufficiently high, more than 1 GPa, so that the grain structure of the AlCu electrode in combination with the seed layer exhibits an increased acoustic hardness during the operation of the electro-acoustic resonator. The thickness of the seed layer in general for the above-mentioned metals may be in the range of 3 nm to 50 nm.

The metals useful for the seed layer and their relevant characteristics are shown in the table below:

|  | Chromium (Cr) | Cobalt (Co) | Niobium (Nb) | Molybdenum (Mo) | Tungsten (W) |
| --- | --- | --- | --- | --- | --- |
| Density [g/cm$^3$] | 7.19 | 8.89 | 8.58 | 10.28 | 19.25 |
| Chrystal Structure | bcc | hcp | bcc | bcc | bcc |
| Vickers-Hardness [GPa] | 1.06 | 1.04 | 1.32 | 1.53 | 3.43 |
| Vickers-Hardness/ Density | 0.147 | 0.117 | 0.154 | 0.149 | 0.178 |

Especially a relatively thick seed layer of chromium exhibits superior power handling characteristics. Chromium has a bcc crystal structure so that the grain sizes of the on-top formed AlCu electrode system are small. Chromium has a considerable Vickers hardness of 1.06 GPa. The density of chromium is 7.19 g/cm$^3$, which is relatively low when compared to other metals. The chromium seed layer should have a thickness of between 10 nm to 20 nm. The preferred thickness of the chromium layer is in the range of 15 nm. A seed layer of chromium provides a stiff, relatively thick seed layer so that it leads to a higher power durability of the electrode structure when compared to conventional metals. Especially at the bottom corners of the electrode, the stiff chromium material can reduce the formation of defects in the AlCu electrode system. In the design of the electrode structure for the SAW resonator, a preferably 15 nm chromium seed layer replaces a conventional 5 nm titanium seed layer so that the mass added by the chromium seed layer should be counterbalanced by the mass of the electrode. Accordingly, the total height of the electrode structure should be reduced when compared to previous solutions.

Furthermore, the depletion of oxygen in the piezoelectric substrate, especially a lithium tantalate substrate, is reduced with chromium seed layers although chromium has a gettering effect on oxygen. Accordingly, the arcing limit is maintained and the mechanical strength of the lithium tantalate substrate is also maintained.

The thickness of the electrode including the seed layer and the aluminum copper system thereon is between 120 nm to 400 nm, depending on the resonance frequency and the field of application of the resonator device. The electrode is covered by a passivation layer which may be a silicon nitride layer of a small thickness such as between 3 nm to 7 nm, preferably 5 nm.

One or more of the above-mentioned objects are also achieved by a method of forming an electro-acoustic resonator, that comprises the steps of: providing a substrate made of a piezoelectric material; forming a copper layer on the piezoelectric material; forming an aluminium layer on the copper layer; forming a barrier layer on the aluminum layer, the barrier layer configured to form a barrier against the diffusion of copper; forming another aluminum layer on the barrier layer; and annealing the formed structure to enable a diffusion of copper from the copper layer into the aluminum layer.

According to an embodiment, a thin layer of copper is disposed on the piezoelectric substrate. The first aluminum layer is formed on the copper layer, the barrier layer is formed on the aluminum layer and the second aluminum layer is formed on the barrier layer. Then, an annealing step is performed to enable a diffusion of copper into the aluminum layer and transform the deposited layer sandwich of the copper and the first aluminum layer into a layer that comprises an intermetallic AlCu-phase. The annealing time and annealing temperature are determined such that the diffusion process reaches saturation so that all copper is transferred into the AlCu-phase. A suitable annealing temperature is in the range of about 270° C. that ensures that the diffusion process reaches saturation. Additional annealing steps will not cause any further modification of the AlCu-layer.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAIL DESCRIPTION OF EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
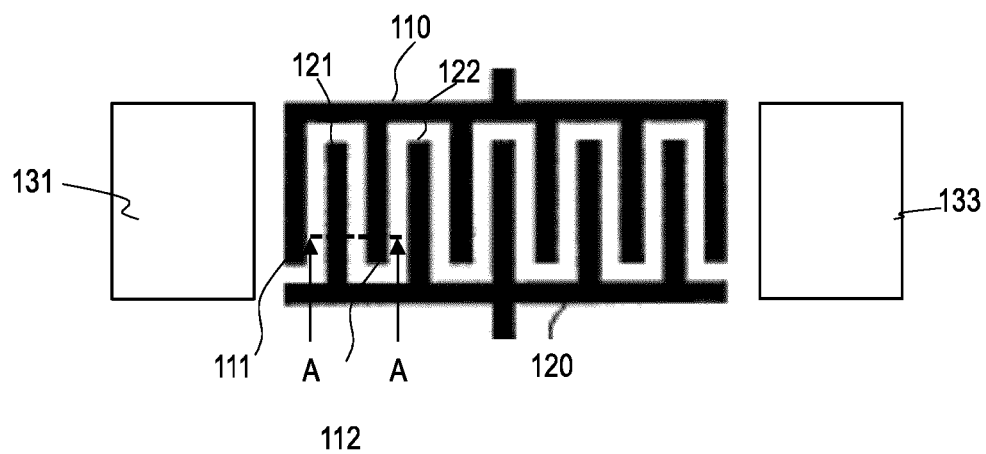
FIG. 1 shows a top view on a SAW resonator.

Turning now to FIG. 1, a top view on an exemplary embodiment of a SAW resonator is shown. The depicted structure comprises an interdigital transducer (IDT) disposed on top of a piezoelectric substrate. The IDT is formed by two electrodes 110, 120, each comprising interleaved fingers 111, 112 and 121, 122, respectively. The shape of the fingers and their length and distance is selected such that the resonator meets expected electrical characteristics such as resonance frequency, Q-factor etc. The resonator may be part of an electronic RF filter, for example, in a mobile communication device such as a smartphone. In practice, the IDT may comprise several hundreds, e.g., about 300 fingers.

In operation, an electrical signal is supplied to the terminals of the IDT structure and generates an acoustic resonating wave within the piezoelectric substrate. In order to avoid leaking of the acoustic wave from the IDT structure, acoustic reflectors 131, 133 are provided adjacent to the side portions of the IDT structure. Examples for the reflectors 131, 133 are shown in FIG. 2, and a cross-section through two adjacent fingers of the electrode pair of the IDT along line A-A is depicted in FIG. 3.

Figure 2:
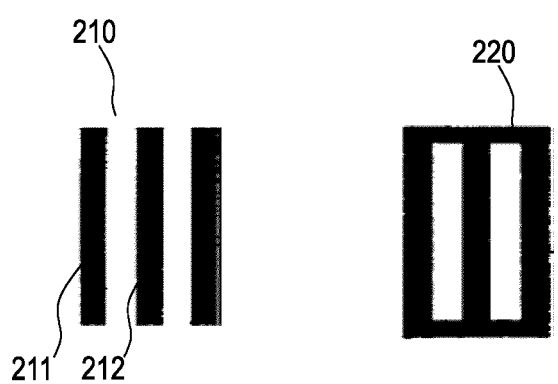
FIG. 2 shows two versions of acoustic reflectors.

Turning now to FIG. 2, depending on the electronic requirements, the reflectors may be open-circuited as shown at 210 or short-circuited as shown at 220. Each reflector includes parallel disposed fingers such as 211, 212. The principles explained in this disclosure with regard to the electrode structures of the IDTs apply to the reflectors as well.

Figure 3:
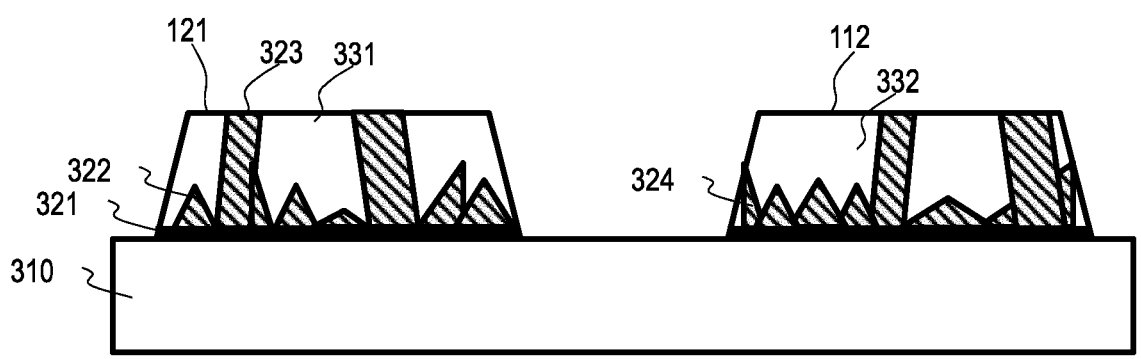
FIG. 3 shows a cross-sectional view of a portion of a conventional SAW resonator.

Turning now to FIG. 3, the cross-section shows substrate 310 and two adjacent fingers 121, 112 of the two electrodes of the IDT along ling A-A of FIG. 1. The substrate 310 has piezoelectric properties and any suitable piezoelectric material may be used. In accordance with the present disclosure, the substrate 310 is made of lithium tantalate ($LiTaO_3$) or lithium niobate ($LiNbO_3$). The conventional finger 121 comprises a seed layer 321 of titanium (Ti) on which a thin copper (Cu) layer is formed. One single aluminum (Al) layer is deposited on the copper layer followed by an anneal step. FIG. 3 shows the resulting structure after the anneal step. The cross-section demonstrates that the copper diffused through the aluminum thereby forming an AlCu-intermetallic phase primarily comprising $Al_2Cu$ grains such as 322, 323, 324 embedded in the remaining unreacted Al grains 331, 332. As can be gathered from FIG. 3, grain 323 reaches the top surface of finger 121, and grain 324 reaches the sidewall surface of finger 112. $Al_2Cu$ grain 323 is in direct contact with the Al material 331 at the top surface of finger 121 so that this structure has a corrosive potential if subjected to corrosive media such as cleaning and rinsing fluids and especially alkaline or acid media. In particular, a problematic situation occurs when the structure shown in FIG. 3 is treated in a photolithography process that uses basic or alkaline solvents for the photodeveloper. Having grains of noble and less noble metals in contact with each other subjected to a basic photodeveloper will lead to a Galvano-corrosive chemical reaction that destroys the less noble metal that is the pure aluminum grains at the surface of the IDT fingers.

Figure 4:
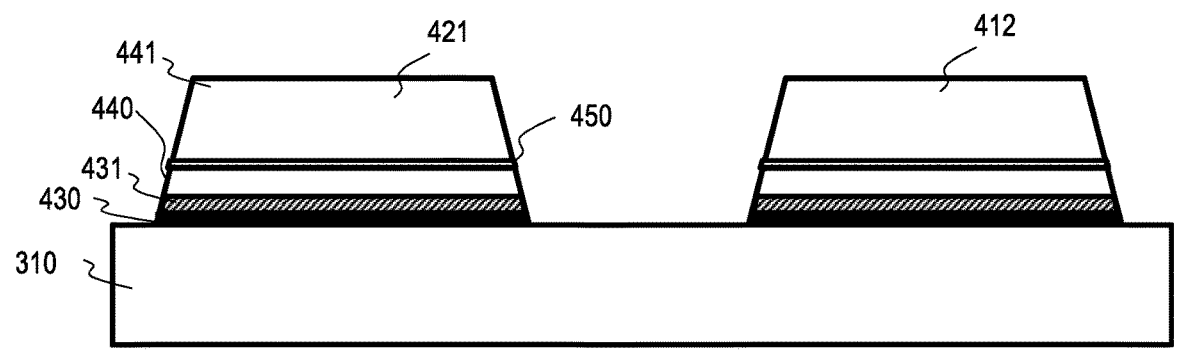
FIG. 4 shows a cross-sectional view of a SAW resonator according to a first embodiment before an annealing step.

FIG. 4 shows a cross-section through a portion of a SAW resonator of a first embodiment at an intermediate step during its production. During manufacturing, the piezoelectric substrate 310 is provided, made of one of the above-described piezoelectric materials. On the surface of the substrate 310 a layer of an adhesion promoter or a seed layer 430 is formed which may be a layer of titanium. Thereon formed is a layer of copper 431 and thereon formed is a first layer of aluminum 440. While aluminum has high electrical conductivity, the addition of copper increases the acoustic hardness of the electrode. On top of the first aluminum layer 440, a barrier layer 450 is deposited. The barrier material for layer 450 is selected such that it forms a barrier against the diffusion of copper. The barrier layer 450 ensures that no copper will diffuse beyond barrier layer 450.

Barrier layer 450 confines the copper in the region between the adhesion layer 430 and the barrier layer 450. On top of barrier layer 450, a second aluminum layer 441 is formed that provides good electrical conductivity. The thickness of layer 441 may be about two times the thickness of layer 440. The layer stack is suitably structured to realize the shape of the electrodes of the IDT as shown in FIG. 1 or the shape of the reflectors as shown in FIG. 2. After deposition and structuring the workpiece as shown in FIG. 4, an anneal step is performed.

Figure 5:
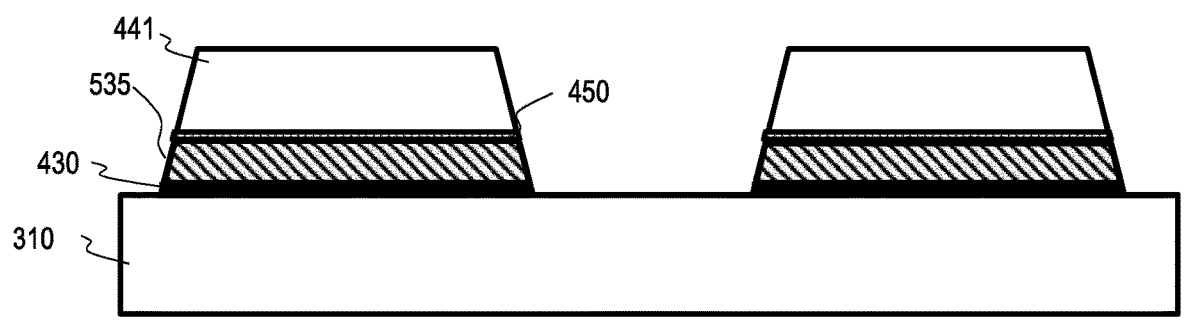
FIG. 5 shows a cross-sectional view of a SAW resonator according to the first embodiment after the annealing step.

FIG. 5 shows a cross-section of the resulting structure after the anneal step. As can be gathered from FIG. 5, the originally deposited copper and aluminum layers 431, 440 are transformed to a new layer 535 that includes grains of an intermetallic AlCu phase, primarily grains of $Al_2Cu$. The anneal step is performed at a temperature of about 270° C. for a sufficiently long time so that the copper from original layer 431 diffuses through the original first aluminum layer 440 and reacts with the aluminum to the intermetallic $Al_2Cu$ phase. This reaction is continued until all available Cu from layer 431 is transformed into the $Al_2Cu$ phase 535 so that the diffusion process reaches saturation. The mass of Cu and the thickness of the Al layer 440 are selected such that no unreacted aluminum from original aluminum layer 440 remains underneath the barrier layer 450. No Al grains remain in the $Al_2Cu$ layer 535 so that layer 535 consists substantially only of $Al_2Cu$ grains with no unreacted Al grains. This requires that the deposited mass of copper in layer 431 is substantially the same as the mass of aluminum in layer 440. The relation of mass of the Cu layer 431 and the Al layer 440 is selected to 1:1. Especially, no copper passes through barrier layer 450 so that no copper from layer 431 reaches the second aluminum layer 441.

The sidewalls of layer 535 include only $Al_2Cu$ grains without any remaining Al grains so that these sidewalls will not be affected by Galvano-corrosion. Specifically, aggressive fluids such as basic or alkaline solvents of photodevelopers will not affect or deteriorate the $Al_2Cu$ layer 535. As an advantage, the structure shown in FIG. 5 can be further treated with photolithography steps so that the shown fingers of the IDT electrodes can be trimmed. Trimming can be made to correct manufacturing variations of electrical parameters and/or to fine-tune a precise resonance frequency of the SAW resonator. The yield of the production process is increased in that a trimming by photolithography is possible.

As another advantage, it is to be noted that the generated $Al_2Cu$ grains are confined to the portion of the electrode finger underneath barrier layer 450 and inbetween barrier layer 450 and substrate 310 or adhesion promoter 430. The portion of the electrode close to the surface of the piezoelectric substrate 310 is subjected to considerable mechanical stress during the acoustic operation of the device when compared to the portion of the electrode distant from the substrate 310 such as the second aluminum layer 441. Because the addition of copper to the aluminum material generates the mechanically harder $Al_2Cu$ grains and the concentration of the $Al_2Cu$ grains is increased in the region close to the substrate, the power durability of the resulting SAW resonator is increased.

The thickness of $Al_2Cu$ layer 535 and the thickness of Al layer 441 is selected such that the acoustic properties are maintained. According to the embodiment of FIGS. 4 and 5, the layers are deposited such with respect to barrier layer 450 that, after the anneal, the thickness of the $Al_2Cu$ layer 535 is about half of the thickness of the aluminum layer 441.

In other words, the thickness of the aluminum layer 441 is about two times the thickness of the $Al_2Cu$ layer 535. Furthermore, considering the combined thickness of layers 441 and 535 or the combined thickness of deposited layers 441 and 440, the barrier layer 450 is positioned at a height of one third ($\frac{1}{3}$) of the combined thickness. This ensures that the IDT electrode design achieves acoustic and electrical characteristics according to the knowledge and experience of the design engineer resulting from conventional electrode designs. Provided that the thickness of the aluminum layer 441 is two times the thickness of the $Al_2Cu$ layer 535 and that the mass of Cu and the mass of Al have a relation of about 1:1 in layer 535, layer 535 contains only $Al_2Cu$ grains and no pure Al grains so that the electrode is highly corrosion resistant and power durable.

The materials useful for the barrier layer comprise such metals or metal nitrides that form a barrier against the diffusion of copper. Suitable metals are titanium, chromium, cobalt, tantalum, tungsten of which the barrier layer 450 can be formed. The barrier layer 450 can be one layer of at least one of said metals or a sandwich of one or more layers of said metals. Furthermore, nitrides of titanium, tantalum or tungsten are possible as one layer or as a sandwich of two or more layers of said nitrides. Also a sandwich of a metal layer with a metal nitride layer is possible.

Figure 6:
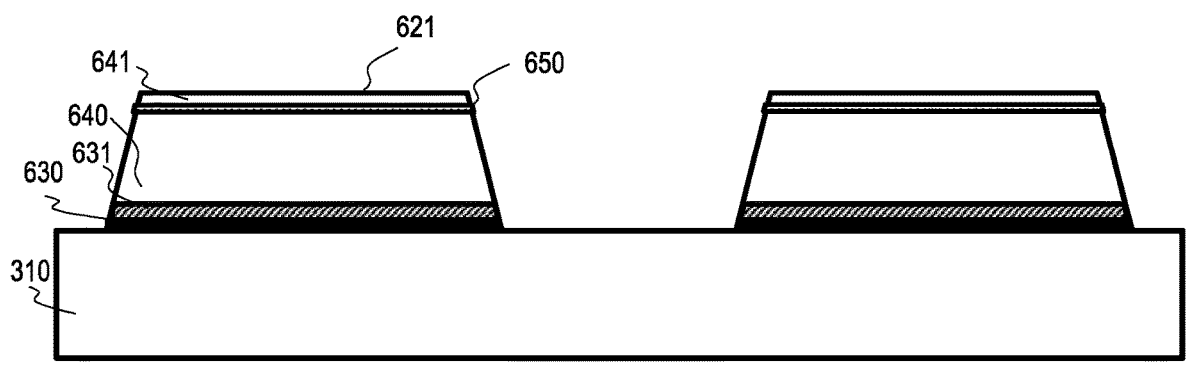
FIG. 6 shows a cross-sectional view of a SAW resonator according to a second embodiment before an annealing step.
Figure 7:
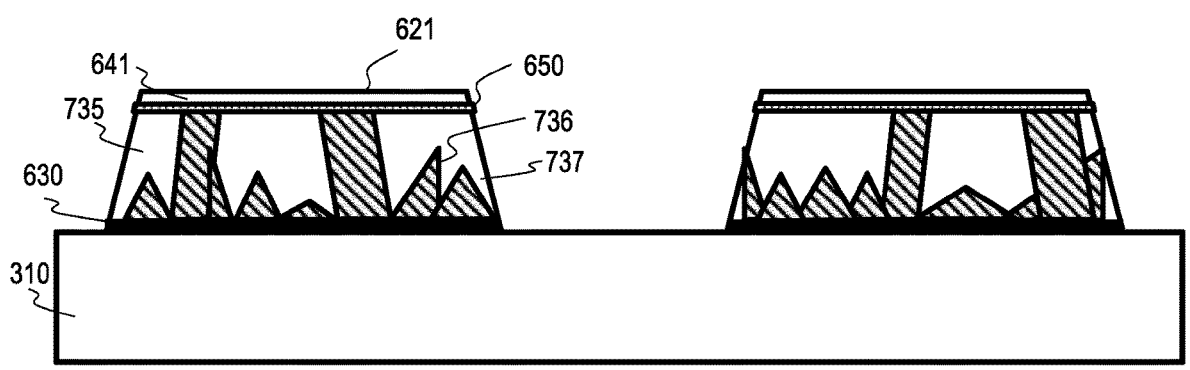
FIG. 7 shows a cross-sectional view of a SAW resonator according to the second embodiment after the annealing step.

According to a second embodiment depicted in FIGS. 6 and 7, the first aluminum layer 640 has a substantially larger thickness than the second aluminum layer 641. The barrier layer 650 is disposed between the two aluminum layers 640, 641. The overall height or thickness of the electrode is determined such that the desired acoustic resonating properties are achieved. The thickness of the second top aluminum layer 641 may be relatively thin, in the range of 15 nm to 30 nm. Preferably, the second aluminum layer has a thickness of between 20 nm to 25 nm. A copper layer 631 is disposed underneath the first aluminum layer 640, and a seed layer 630 is disposed underneath the copper layer 631.

Turning now to FIG. 7, a cross-sectional view of the electrodes is shown after an anneal step. The copper from original layer 631 diffused through the first aluminum layer 640 and formed $Al_2Cu$ grains 736. The mass of copper in copper layer 631 is in the range of 2 to 9 weight-% compared to the above-disposed aluminum layer 640 so that, after the anneal, unreacted aluminum grains 737 are still present in the first metal layer 735 below the barrier layer 640. $Al_2Cu$ grains may reach the sidewall surfaces of the electrode 621 in connection with Al grains. However, the barrier layer 650 prevents the copper from diffusing into the top aluminum layer 641 so that no $Al_2Cu$ grains reach the top surface of the electrode. The embodiment depicted in FIG. 7 is substantially corrosion-resistant in that the top surface of the electrode 621 includes only pure Al grains and no $Al_2Cu$ grains. The latter are confined to the portion below the barrier layer 650. On the other hand, the lower electrode includes $Al_2Cu$ grains in connection with Al grains. This combination exhibits sufficient acoustic hardness for certain ranges of resonance frequencies.

The adhesion layer or seed layer 430, 630 may be made of titanium. As an alternative, the material of the seed layer 430, 630 is selected from one of chromium, cobalt, niobium, molybdenum and tungsten. In the following, it is assumed that seed layer 430, 630 is made of chromium. The seed layer 430, 630 of chromium has a thickness of between 10 nm to 20 nm, preferably 15 nm. The overall height of the electrode reaching from the bottom of the seed layer or the top surface of the piezoelectric substrate to the top surface of the electrode is between 120 nm and 400 nm depending on the frequency range and the field of application of the SAW resonator. A relatively thin layer of silicon nitride (not shown) covers the electrode. The silicon nitride layer has a thickness of between 3 nm to 7 nm, preferably 5 nm. The chromium seed layer has a relatively high Vickers hardness of 1.06 GPa and a moderate density of 7.19 $g/cm^3$. Accordingly, the chromium seed layer is relatively hard and may be dimensioned relatively thick. This increases the acoustic stability of the AlCu portion of the electrode, especially in the bottom portion which is in contact with or close to the seed layer and especially at the corner portions of the electrode close to the sidewall surface portions of the electrode near the seed layer. Compared to conventional systems, the height of the electrode is to be reduced thereby counterbalancing the mass added by the chromium layer. This does not noticeably increase the electrical resistance of the IDT or affect the resonator frequency.

The improved power durability of the electrode avoids defects and cracks that may be generated or may propagate in the aluminum grains or in the aluminum copper grains or along the grain boundaries so that the setup resonance frequency of the SAW resonator is maintained over its lifetime.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirt and substance of the disclosure may occur to the persons skilled in the art, the disclosure should be construed to include everything within the scope of the appended claims.

The invention claimed is:

1. An electro-acoustic resonator, comprising:
   a substrate, the substrate having piezoelectric properties; and
   an electrode structure disposed on the substrate, the electrode structure comprising:
      a metal layer, the metal layer comprising aluminum and copper, wherein, within the metal layer, a mass of the copper is substantially equal to a mass of the aluminum;
      a barrier layer disposed on the metal layer and configured to form a barrier against a diffusion of copper; and
      another metal layer disposed on the barrier layer, the other metal layer comprising aluminum.

2. The electro-acoustic resonator of claim 1, wherein the metal layer comprises grains of an intermetallic phase comprising aluminum and copper.

3. The electro-acoustic resonator of any of claims 1 to 2, wherein the barrier layer comprises a metal or a metal nitride.

4. The electro-acoustic resonator of any of claims 1 to 2, wherein the barrier layer comprises at least one of titanium, chromium, cobalt, tantalum, tungsten, or a nitride of one of titanium, tantalum, or tungsten.

5. The electro-acoustic resonator of any of claims 1 to 2, wherein a thickness of the metal layer is at least half of a thickness of the other metal layer.

6. The electro-acoustic resonator of any of claims 1 to 2, wherein a thickness of the metal layer is larger than a thickness of the other metal layer.

7. The electro-acoustic resonator of any of claims 1 to 2, wherein the substrate comprises lithium tantalate or lithium niobate.

8. The electro-acoustic resonator of any of claims 1 to 2, further comprising a seed layer disposed between the substrate and the metal layer, the seed layer comprising at least one of titanium or chromium.

9. The electro-acoustic resonator of any of claims 1 to 2, further comprising a seed layer disposed between the substrate and the metal layer, the seed layer comprising a metal, wherein the metal has a hardness of at least 1 gigapascal.

10. The electro-acoustic resonator of claim 9, wherein the seed layer comprises a metal having one of a body centered cubic crystal structure or a hexagonal closed packed crystal structure.

11. The electro-acoustic resonator of claim 9, wherein the seed layer comprises a metal selected from the group consisting of chromium, cobalt, niobium, molybdenum, and tungsten.

12. The electro-acoustic resonator of any of claims 1 to 2, wherein the electro-acoustic resonator is a surface acoustic wave resonator and wherein the electrode structure forms an interdigital transducer arrangement.

\* \* \* \* \*